United States Patent [19]
Becker et al.

[11] Patent Number: 6,072,730
[45] Date of Patent: Jun. 6, 2000

[54] LOW POWER DIFFERENTIAL SIGNAL TRANSITION TECHNIQUES FOR USE IN MEMORY DEVICES

[75] Inventors: Scott T. Becker; Steve P. Kornachuk, both of San Jose, Calif.

[73] Assignee: Artisan Components, Inc., Sunnyvale, Calif.

[21] Appl. No.: 09/177,859

[22] Filed: Oct. 23, 1998

Related U.S. Application Data

[60] Provisional application No. 60/063,508, Oct. 25, 1997.

[51] Int. Cl.$^7$ ................................................ G11C 7/00
[52] U.S. Cl. .................... 365/190; 365/205; 365/230.03
[58] Field of Search .................................. 365/190, 205, 365/230.03, 189.01, 230.01

[56] References Cited

U.S. PATENT DOCUMENTS

| | | | |
|---|---|---|---|
| 5,270,590 | 12/1993 | Pascucci .................................. | 307/530 |
| 5,283,760 | 2/1994 | Chin et al. ........................... | 365/189.01 |
| 5,642,324 | 6/1997 | Ghosh et al. ....................... | 365/230.03 |
| 5,677,864 | 10/1997 | Chung .................................. | 365/63 |
| 5,680,357 | 10/1997 | Sung et al. .............................. | 365/210 |
| 5,751,649 | 5/1998 | Kornachuk et al. .................... | 365/205 |
| 5,781,496 | 7/1998 | Pinkham et al. ................... | 365/230.03 |
| 5,783,480 | 7/1998 | Seo et al. ................................ | 438/599 |
| 5,808,933 | 9/1998 | Ross, Jr. et al. ........................ | 365/156 |
| 5,818,785 | 10/1998 | Ohshima ............................. | 365/230.03 |
| 5,831,919 | 11/1998 | Haukness et al. ...................... | 365/205 |
| 5,831,924 | 11/1998 | Nitta et al. .......................... | 365/230.03 |
| 5,844,851 | 12/1998 | Pascucci et al. ....................... | 365/210 |
| 5,892,725 | 4/1999 | Lattimore et al. ................. | 365/230.03 |
| 5,917,744 | 6/1999 | Kirihata et al. ........................... | 365/63 |

*Primary Examiner*—David Nelms
*Assistant Examiner*—Hoai V. Ho
*Attorney, Agent, or Firm*—Martine Penilla & Kim, LLP

[57] ABSTRACT

A low power bank architecture implemented in memory access circuitry is disclosed. The bank architecture includes a bank circuit that has a bank core integrated with a pair of bitlines and a bank interface circuit that is coupled to the pair of bitlines. The bank architecture further includes a global data bus pair that is configured to communicate a less than full rail voltage swing. The global data bus pair is coupled to the bank interface circuit of the bank circuit that is designed to convert the less than full rail voltage swing into an up to about full rail voltage swing that is communicated to the pair of bitlines. The bank circuit is configured to be replicated once for each of the pair of bitlines in a memory core having an array of bank cores. By communicating memory access signals, such as differential write data, at a less than full rail voltage over the global data bus pair, a substantial amount of power is saved, which provides excellent power savings for many electronic device applications.

24 Claims, 4 Drawing Sheets

LOW POWER DIFFERENTIAL SIGNAL TRANSITION TECHNIQUES FOR USE IN MEMORY DEVICES

CROSS REFERENCE TO RELATED APPLICATIONS

This application claims the benefit of U.S. Provisional patent application having Ser. No. 60/063,508, filed on Oct. 25, 1997, entitled "Low Power Differential Signal Transition Techniques For Use In Memory Devices." This application is hereby incorporated by reference.

BACKGROUND OF THE INVENTION

1. Field of the Invention

The present invention relates generally to integrated circuits, and more particularly to methods and apparatus for low power memory accessing techniques.

2. Description of the Related Art

Semiconductor memory cores are usually laid-out in array format, such that each individual core cell is coupled by a wordline and a pair of differential bitlines. To access data stored in a selected core cell, associated memory accessing circuitry is commonly designed around a memory core. For example, some of the key memory accessing circuitry typically includes addressing circuitry for selecting a core cell, wordline drivers for driving a selected wordline, and sense amplifiers for amplifying the signal read from the selected core cell.

In low power memory applications, there is typically a need to reduce the amount of power consumption that occurs at every stage of a memory's function. Conventionally, memory designers have been using a bank architecture to reduce power consumption, when access to particular columns in a memory core are performed. In general, a bank architecture will generally include a plurality of banks that are used to individually address a single core cell (i.e., one for each bit) along a selected wordline.

This is contrary to other conventional memory accessing circuitry, such as bit sliced architectures that use Y-MUX decoders to access "m" columns of a memory core. As is well known, when a Y-MUX decoder accesses a particular core cell, all other core cells that lie along the selected wordline will also be accessed, and therefore consume power. As such, in low power applications, designers prefer to use bank architectures as compared to bit sliced architectures, to reduce the amount of power being consumed during memory access operations.

As mentioned above, the bank architecture is superior to the bit sliced architectures in terms of power consumption, because only one column per bit in a memory core will be accessed by a bank at one time, and thereby eliminates the power consumed by non-selected columns. For ease of understanding, FIG. 1 shows a conventional bank architecture for performing write operations to a memory core. As shown, an input write circuit 102 is provided to receive data from a user, and then output a differential signal (i.e., global data bus "GDB", "/GDB"), that is transferred to a BANK 1.

In most prior art systems, the input write circuit 102 is configured to output the differential signals GDB and /GDB to each of the banks that may be used to access the number of columns contained in a particular memory device. As pictorially illustrated, the input write circuit 102 is generally configured to drive any number of banks up to BANK N, when a memory core has N columns per bit. Therefore, when BANK 1 is selected to write data to a core cell 110, a BANK 1 select signal will be passed to a bank interface circuit 104. Bank interface circuit 104 is then configured to output a differential signal (i.e., BIT, and /BIT) to the core cell 110 when a wordline 112 is selected.

A problem with the bank architecture 100 of FIG. 1 is that a substantial amount of power is consumed during writing operations. For example, the data that is being written to the core cell 110 is being fed through the input write circuit 102, and through a large global data bus (GDB, /GDB) that is driven at full rail voltages. For example, the logical elements in this circuitry are driven by signals that swing between Vss and Vdd (e.g., 0 and 2.5 volts). As such, the power consumed in performing the write operation is many times too large for applications that require substantially lower power consumption.

By way of example, the power consumed through a particular circuit is measured by the equation, Power=$CV^2f$. Therefore, a major component of power is the voltage level that is used to drive the large global data bus in a banking architecture. In this example, assuming that Vdd is equal to 2.5 volts, the frequency is 1 MHz, and the capacitance is 1 pf. The power consumption will be about 6.25 $\mu$Watts. Further, the large global data bus (GDB and /GDB) generally has a very heavy capacitive load, that unfortunately translates into more power being consumed to drive the large global data bus.

In view of the foregoing, there is a need for low power bank architecture memories that implement techniques that substantially reduce the voltage swing used to drive the global data bus, and thereby substantially reduce power consumption in low power memory applications.

SUMMARY OF THE INVENTION

Broadly speaking, the present invention fills these needs by providing methods and apparatuses for performing low power data access operations (i.e., reads and writes) in bank memory architectures. It should be appreciated that the present invention can be implemented in numerous ways, including as a process, an apparatus, a system, a device, or a method. Several embodiments of the present invention are described below.

In one embodiment, a low power bank architecture implemented in memory access circuitry is disclosed. The bank architecture includes a bank circuit that has a bank core integrated with a pair of bitlines and a bank interface circuit that is coupled to the pair of bitlines. The bank architecture further includes a global data bus pair that is configured to communicate a less than full rail voltage swing. The global data bus pair is coupled to the bank interface circuit of the bank circuit and is designed to convert the less than full rail voltage swing to a full rail voltage swing that is communicated to the pair of bitlines. By communicating memory access signals at a less than full rail voltage over the global data bus pair, a substantial amount of power is saved due to the fact that voltage in a power equation is a squared variable. As such, amplification is done locally at the bank interface circuit just before the pair of bitlines are driven.

In another embodiment, a lower power memory access circuit is disclosed. The memory access circuit includes a memory core having a plurality of core cells arranged in an array format of columns and rows. The memory access circuit also includes a plurality of bank circuits, each of which correspond to each of the columns of the memory core. Also provided is an input write circuit for receiving user data that is to be written to selected ones of the plurality of core cells of the memory core. A pair of global data bus lines are further coupled between each of the plurality of bank circuits and the input write circuit. The pair of global data bus lines are configured to communicate a less than full rail voltage swing to selected ones of the plurality of bank circuits. The memory access circuit further has a plurality of bank interface circuits integrated with each of the plurality of bank circuits, such that each of the plurality of bank interface circuits are configured to amplify the less than full rail voltage into a full rail voltage just before communicating to a selected one of the plurality of core cells.

In still another embodiment, a bank circuit for facilitating low power write operations to a memory core is disclosed. The bank circuit includes a bank interface circuit. The bank interface circuit includes: (a) an input data sense amplifier that is configured to receive a pair of global bitlines carrying a less than full rail voltage swing, such that the less than full rail voltage swing is configured to be amplified to a full rail voltage swing; (b) a write disable line; (c) a pair of logic gates, and each of the pair of logic gates have a first input from the input data sense amplifier and a second input that is coupled to the write disable line; (d) a pair of bitlines that are coupled to outputs of the pair of logic gates, and the pair of bitlines are configured to receive the full rail voltage swing. The bank circuit further includes a core cell that is part of the memory core, and the core cell is coupled to the pair of bitlines that enable a low power write operation.

In accordance with the several embodiments of the present invention, to reduce the consumption of power during memory access operations (e.g., a write operation), the global data bus (GDB, /GDB) is preferably only allowed to receive a partial differential voltage swing (i.e., ΔV). When the partial differential voltage swing of the global data bus is received at a bank interface circuit, the partial differential voltage swing is amplified to a full rail voltage (i.e., Vss and Vdd). Preferably, the partial differential voltage swing is amplified in an improved bank interface circuit, that includes an input data sense amplifier that is well suited to produce a full rail voltage swing at the bitlines that couple to a selected core cell.

It is important to note that substantial power savings are realized by driving the global data bus with only a partial voltage swing. For example, in the prior art, when the global data bus is allowed to swing full rail, the Vdd voltage may be as high as about 2.5 volts (or 5V in some systems), the capacitance may be about 1 pf, and the frequency may be about 1 MHz. When these conditions are present, the consumed power, following the formula Power=Capacitance×Volts$^2$×frequency, will be about 6.25 μWatts. In contrast, because the less than full rail swing of the present invention may be as low as about 100 mV or lower, the power consumed can be brought down as low as about 0.01 μWatts. In this example, up to about 625 times less power is consumed by having the less than full rail voltage swing on the global data bus pair. Thus, it is significant to recognize that power consumption is substantially reduced because voltage is a squared variable.

Therefore, by only swinging the global data bus to a partial rail (i.e., where most of the large power consumption occurs), and then amplifying the data right before it is time to drive the bit lines, the amount of power consumed in a bank architecture is significantly reduced. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for performing low power data access operations (i.e., reads and writes) in bank memory architectures is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
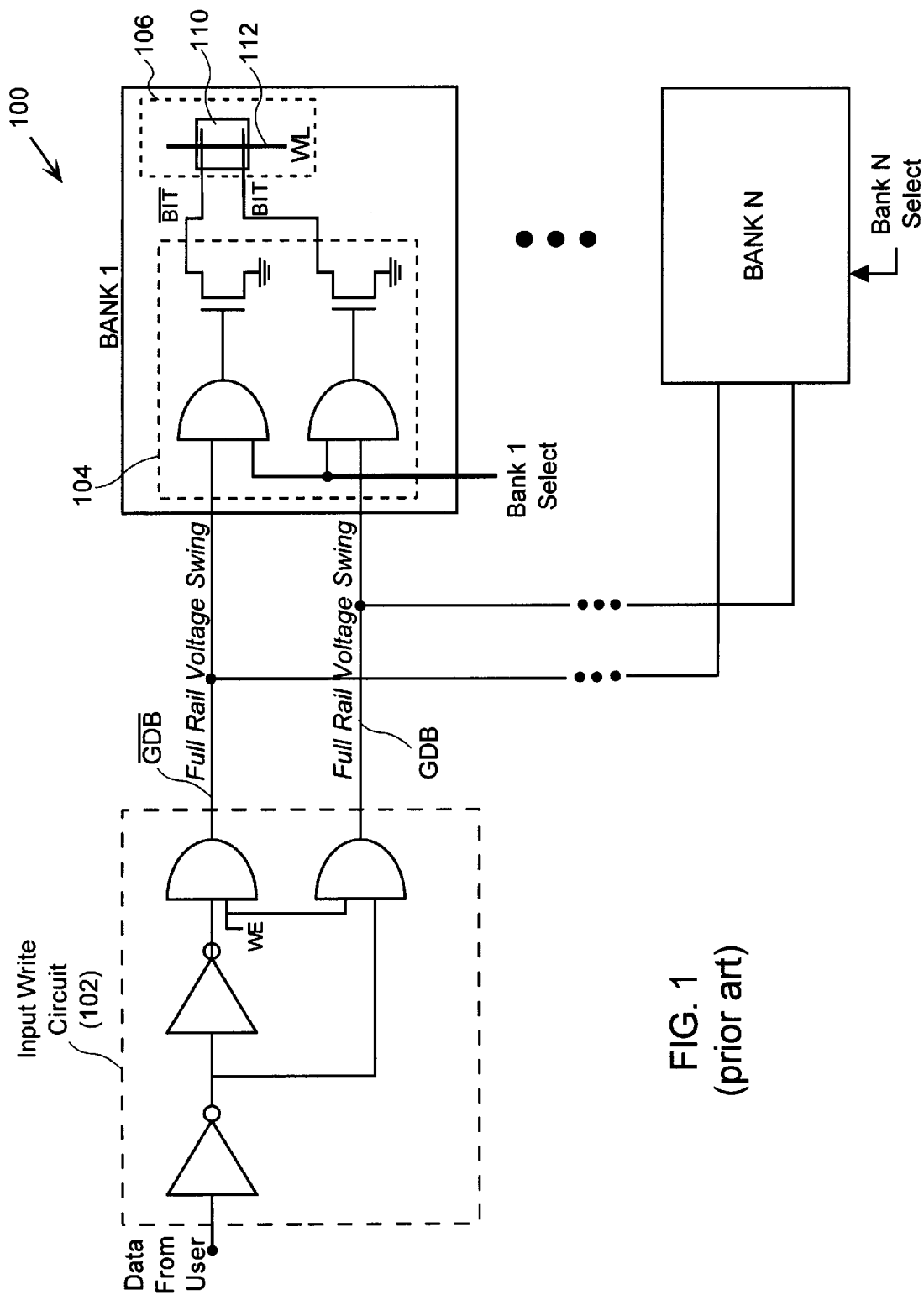
FIG. 1 shows a conventional memory bank architecture and the associated high power consumption drawbacks.
Figure 2A:
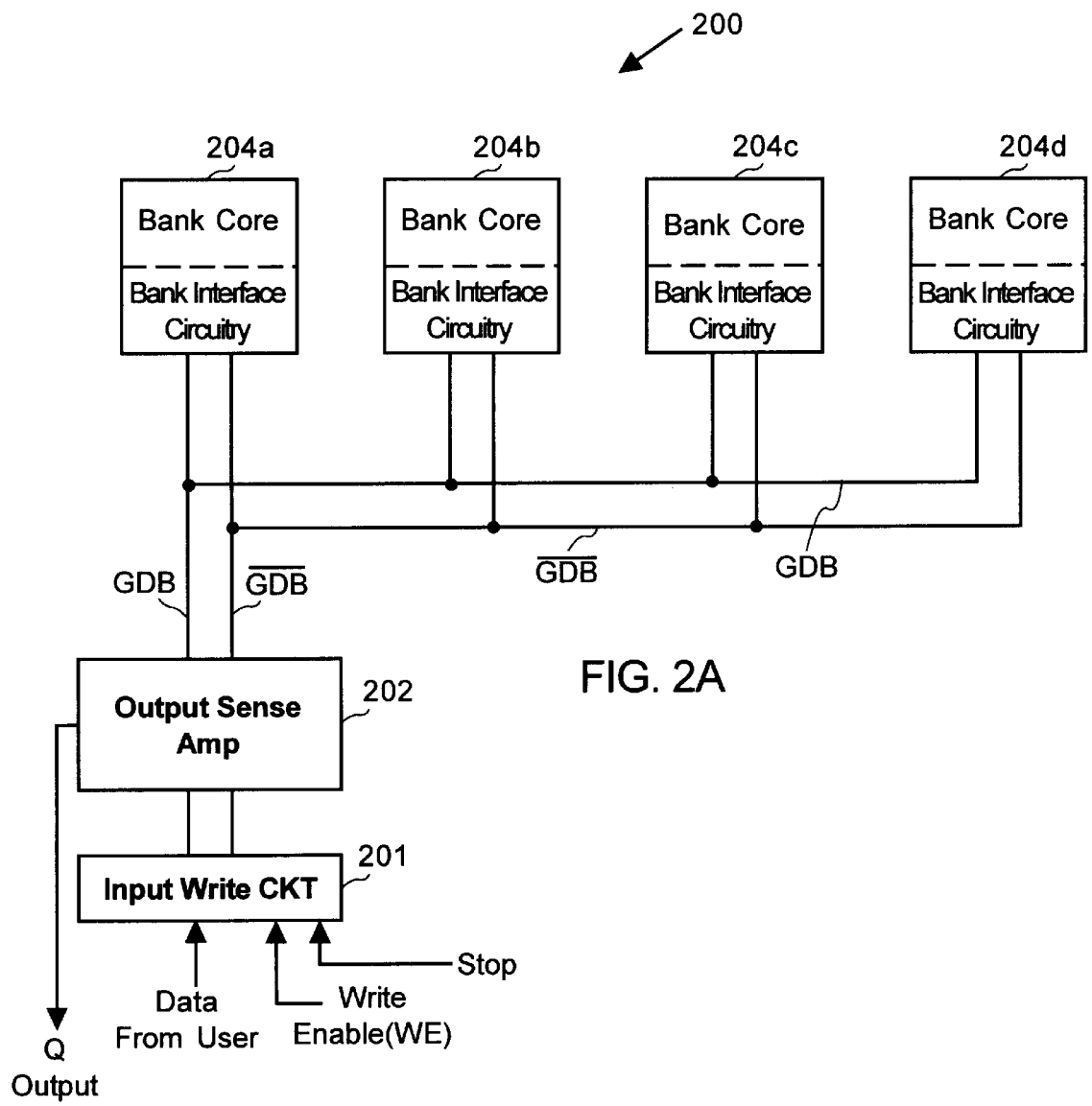
FIG. 2A shows a bank architecture having a substantially lower differential voltage swing in the global data bus (GDB, /GDB) in accordance with one embodiment of the present invention.

FIG. 2A shows a bank architecture having a substantially lower differential voltage swing in a global data bus (GDB, /GDB), in accordance with one embodiment of the present invention. The bank architecture 200 includes an input write circuit 201 that is configured to receive data from a user. The input write circuit 201 also receives a write enable (WE) and a stop signal. The input write circuit 201 is differentially coupled to an output sense amplifier 202.

The output sense amplifier 202 is shown capable of producing a "Q" output, and being coupled to banks 204a, 204b, 204c, and 204d through the differential data bus (GDB, /GDB). For more information on exemplary output sense amplifier circuits (i.e., sense amplifier 202), reference may be made to commonly assigned U.S. patent applications: (1) Ser. No. 08/806,335, entitled "HIGH SPEED MEMORY OUTPUT CIRCUITRY AND METHODS FOR IMPLEMENTING SAME; and (2) Ser. No. 08/839,151, entitled "VOLTAGE SENSE AMPLIFIER AND METHODS FOR IMPLEMENTING THE SAME." The two applications identified above are hereby incorporated by reference.

In general, each of the banks 204a, 204b, 204c, and 204d will include a bank core that leads to a selected core cell for outputting one bit. Therefore, it should be understood that any number of banks 204 may be provided depending on the number of columns (i.e., bits) that are designed to be part of a particular memory core. The banks 204 also include a bank interface circuit, and the bank core that has a selected core cell that may be addressed.

Figure 2B:
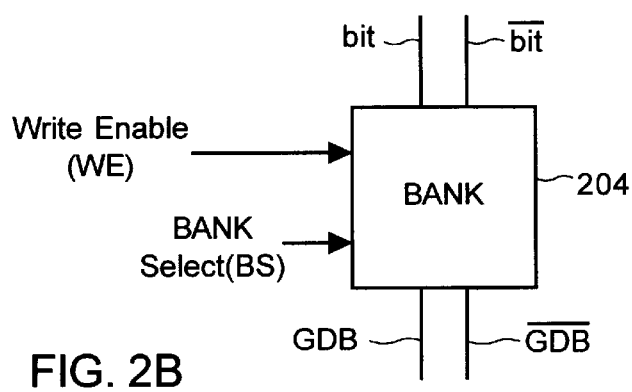
FIG. 2B is a more detailed diagram of the banks in accordance with one embodiment of the present invention.

FIG. 2B is a more detailed diagram of the banks 204 in accordance with one embodiment of the present invention. In this example, the bank 204 is shown receiving a bank select (BS) signal and a write enable (WE) signal, which is used to identify when a particular bank 204 should be selected to address a core cell. For example, if bank 204 is not selected to be addressed, the bank select signal will indicate to the de-selected bank 204 that it should not activate.

Figure 3:
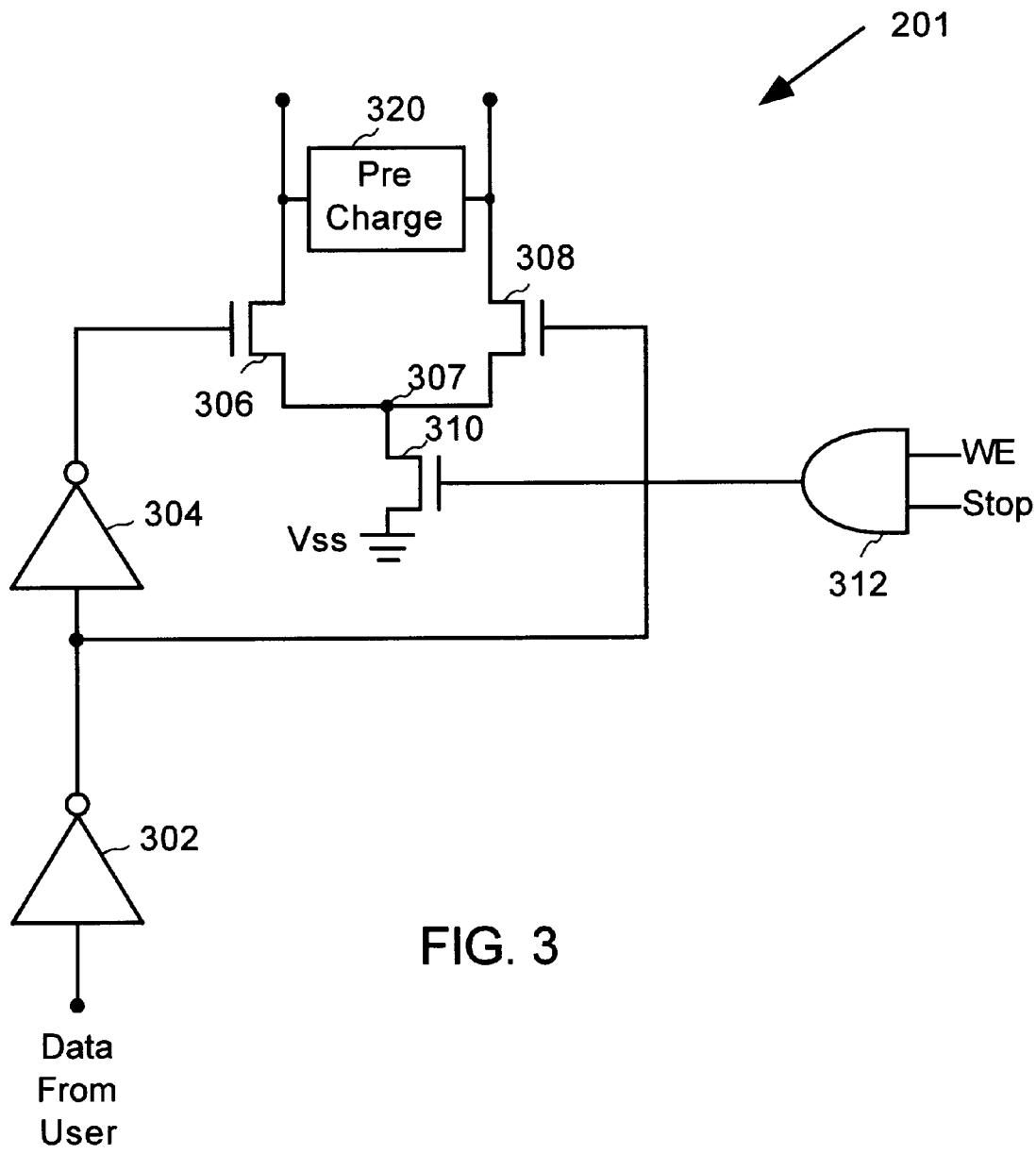
FIG. 3 shows an example input write circuit diagram in accordance with one embodiment of the present invention.

FIG. 3 shows an example input write circuit diagram 201 in accordance with one embodiment of the present invention. Input write circuit 201 shows the data from user being input to a first inverter 302. The output of first inverter 302 is then passed to an inverter 304 and a gate of a transistor 308. The output of inverter 304 is then coupled to the gate of a transistor 306.

Transistors 306 and 308 have one terminal coupled to a node 307, and the other respective terminals coupled to the global data bus (GDB, /GDB). Coupled between the global data bus is a pre-charge unit 320. Pre-charge unit 320 may be any suitable pre-charge circuitry which is well known in the art. A transistor 310 is then shown coupled between node 307 and Vss. The gate of transistor 310 is shown coupled to an output of an AND gate 312 that has a write enable (WE) input, and the stop input.

In general, transistor 310 is a pull-down type transistor that is enabled for writing until the stop signal is provided to the input write circuit 201 in this embodiment. Generally, the stop signal is generated from a model path that approximates when the transistor 310 should be turned off.

Figure 4:
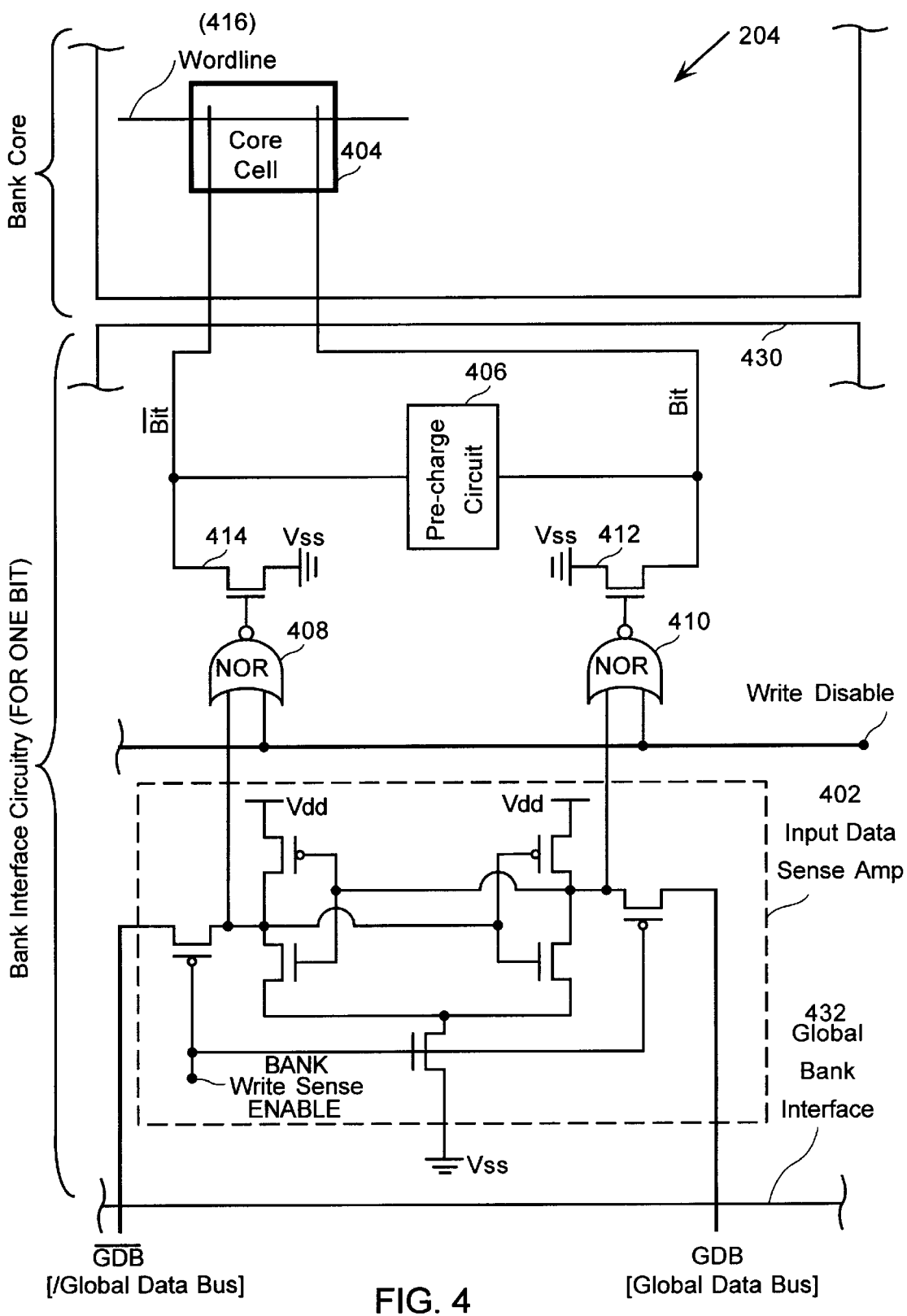
FIG. 4 is a more detailed circuit diagram of a bank in accordance with one embodiment of the present invention.

FIG. 4 is a more detailed circuit diagram of a bank 204 in accordance with one embodiment of the present invention. As shown, bank 204 includes bank interface circuitry that lies between an interface 430 and an interface 432. It should be understood, that the bank interface circuitry shown in FIG. 4 is used for writing a single bit to a bank core column, and therefore, will be replicated any number of times.

In this embodiment, the bank interface circuitry includes an input data sense amplifier 402 which is configured to receive the global data bus (GDB, /GDB) signal that has a very low differential voltage swing ranging between about 5 mV and about 500 mV, and in a specific example, being about 100 mV. This less than full rail voltage is therefore provided to the global data bus pair, and received from the input write circuit 201 during a write operation. The input data sense amplifier 402 will also be configured to receive a bank write sense enable signal, and output a pair of signals to NOR gates 408 and 410. It is important to note that the input data sense amplifier 402 is used to amplify the very low differential voltage to a full rail swing just before the bitlines are driven. In one embodiment, the full rail voltage swing may be between 0 V and about 5 V, between 0 V and about 2.5 V, or between any other custom voltage swing range.

As mentioned above, by only swinging the global data bus to a partial rail (i.e., where most of the large power consumption occurs), and then amplifying the data right before it is time to drive the bit lines, the amount of power consumed in a bank architecture is significantly reduced.

NOR gates 408 and 410 are also shown coupled to a write disable line, which will disable the NOR gates and produce a zero output when it goes HI. The outputs of the NOR gates 408 and 410 are then coupled to the gates of transistors 414 and 412, respectively. The transistors 412 and 414 are shown outputting the BIT and /BIT signal that is passed to a core cell 404 (i.e., core cell 404 lies in the bank core). In this example, a pre-charge circuit 406 is shown coupled between the BIT and /BIT lines to perform conventional pre-charging as may be required.

Furthermore, it should be appreciated that the embodiments of the present invention may be applied to any memory circuit signal or memory circuit, such as ROM memory circuits, RAM memory circuits, SRAM memory circuits, DRAM memory circuits, EPROM memory circuits, EEPROM memory circuits, etc. For more information on memory circuits and core cells, reference may be made to a book entitled "The Art of Electronics, $2^{nd}$ Edition," by Paul Horowitz and Winfield Hill, pages 812–820 (1996). This book is hereby incorporated by reference.

As mentioned above, the described power saving embodiments may be applied to other signals. For example, other signals may include an ADDRESS signal, a WRITE ENABLE signal, a CHIP ENABLE signal, an OUTPUT ENABLE, a CLK signal, or any other memory control signal. As such, these and other signals will find substantial low power advantages when they are differentially driven over a bus with a very low voltage swing, and then locally amplified where a full rail signal may be needed.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation.

By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A low power bank architecture implemented in memory access circuitry, comprising:
   a bank circuit, including,
     a bank core integrated with a pair of bitlines; and
     a bank interface circuit including an input data sense amplifier, a write disable line and a pair of logic gates, each of the logic gates having a first input coupled to the write disable line and a second input coupled to the input data sense amplifier, such that the bank interface circuit is coupled to the pair of bitlines and the pair of logic gates have outputs that couple to the pair of bitlines; and
   a global data bus pair configured to communicate a less than full rail voltage swing, the global data bus pair being coupled to the bank interface circuit of the bank circuit, the bank interface circuit is designed to convert the less than full rail voltage swing to an up to about full rail voltage swing that is communicated to the pair of bitlines.

2. The low power bank architecture implemented in memory access circuitry as recited in claim 1, wherein the memory access circuitry is configured to access a memory core, the memory core is arranged in an array format having columns of bank cores and rows of bank cores, such that each column of bank cores represents a bit width of the memory core.

3. The low power bank architecture implemented in memory access circuitry as recited in claim 2, further comprising:
   a plurality of bank circuits, each of the plurality of bank circuit being defined by the bank circuit, and each column of the bank cores is integrated to each of the plurality of bank circuits.

4. The low power bank architecture implemented in memory access circuitry as recited in claim 1, wherein the input data sense amplifier is configured to receive the global data bus pair, and the bank interface further includes a bank write sense enable signal that is coupled to the input data sense amplifier.

5. The low power bank architecture implemented in memory access circuitry as recited in claim 4, wherein the bank interface circuit further includes:

a pre-charge circuit coupled between the pair of bitlines.

6. The low power bank architecture implemented in memory access circuitry as recited in claim 5, wherein the input data sense amplifier is configured to perform the converting of the less than full rail voltage swing to the up to about full rail voltage swing just before the pair of bitlines are driven.

7. The low power bank architecture implemented in memory access circuitry as recited in claim 6, wherein the bank core that is integrated with the pair of bitlines is also integrated with a wordline.

8. The low power bank architecture implemented in memory access circuitry as recited in claim 1, wherein the less than full rail voltage swing of the global data bus pair consumes substantially less power than a full rail voltage swing global data bus.

9. The low power bank architecture implemented in memory access circuitry as recited in claim 8, wherein up to about 625 times less power is consumed via the global data bus.

10. The low power bank architecture implemented in memory access circuitry as recited in claim 8, wherein the less than full rail voltage swing is between about 5 mV and about 500 mV.

11. The low power bank architecture implemented in memory access circuitry as recited in claim 8, wherein the less than full rail voltage swing is about 100 mV.

12. The low power bank architecture implemented in memory access circuitry as recited in claim 8, wherein the full rail voltage swing is between about 0.9V and about 5V.

13. A lower power memory access circuit, comprising:

a memory core having a plurality of core cells arranged in an array format of columns and rows;

a plurality of bank circuits, each corresponding to each of the columns of the memory core;

an input write circuit for receiving user data to be written to selected ones of the plurality of core cells of the memory core;

a pair of global data bus lines being coupled between each of the plurality of bank circuits and the input write circuit, the pair of global data bus lines being configured to communicate a less than full rail voltage swing to selected ones of the plurality of bank circuits; and a plurality of bank interface circuits being integrated with each of the plurality of bank circuits, each of the plurality of bank interface circuits being configured to amplify the less than full rail voltage into an up to about full rail voltage just before communicating to a selected one of the plurality of core cells;

whereby each of the plurality of bank interface circuits includes an input data sense amplifier, a write disable line, and a pair of logic gates, each of the logic gates having a first input coupled to the write disable line and a second input coupled to the input data sense amplifier, the pair of logic gates having outputs that couple to a pair of bitlines of one of the columns.

14. The lower power memory access circuit as recited in claim 13, wherein each of the plurality of bank interface circuits further comprises:

a pre-charge circuit coupled between the pair of bitlines.

15. The lower power memory access circuit as recited in claim 14, wherein the input data sense amplifier is configured to perform the amplifying of the less than full rail voltage swing to the up to about full rail voltage swing just before the pair of bitlines are driven.

16. The lower power memory access circuit as recited in claim 13, wherein the less than full rail voltage swing of the pair of global data bus lines consumes substantially less power than a full rail voltage swing global data bus.

17. The lower power memory access circuit as recited in claim 16, wherein up to about 625 times less power is consumed via the less than full rail voltage swing of the pair of global data bus lines.

18. The lower power memory access circuit as recited in claim 17, wherein the less than full rail voltage swing is between about 5 mV and about 500 mV.

19. A bank circuit for facilitating low power write operations to a memory core, comprising:

a bank interface circuit, including, an input data sense amplifier configured to receive a pair of global bitlines carrying a less than full rail voltage swing, the less than full rail voltage swing configured to be amplified to an up to about full rail voltage swing;

a write disable line;

a pair of logic gates, each of the pair of logic gates having a first input from the input data sense amplifier and a second input coupled to the write disable line;

a pair of bitlines being coupled to outputs of the pair of logic gates, the pair of bitlines are configured to receive the up to about full rail voltage swing; and a core cell that is part of the memory core, the core cell is coupled to the pair of bitlines that enable a low power write operation.

20. The bank circuit for facilitating low power write operations to a memory core as recited in claim 19, wherein the input data sense amplifier of the bank interface circuit further includes a bank write sense enable.

21. The bank circuit for facilitating low power write operations to a memory core as recited in claim 19, further including, a pre-charge circuit being coupled between the pair of bitlines.

22. The bank circuit for facilitating low power write operations to a memory core as recited in claim 19, wherein the bank interface circuit is replicated once for each one of a plurality of columns in the memory core, and the pair of global data bus are routed to each of the replicated bank interface circuit.

23. The bank circuit for facilitating low power write operations to a memory core as recited in claim 19, wherein each of the pair of logic gates are NOR gates.

24. The bank circuit for facilitating low power write operations to a memory core as recited in claim 19, wherein gates of a pair of transistors are coupled to an output of the pair of logic gates, a first terminal of the transistors is coupled to ground, and a second terminal of the transistors is coupled to the pair of bitlines.

* * * * *